US006753217B2

(12) United States Patent
Gudesen

(10) Patent No.: US 6,753,217 B2
(45) Date of Patent: Jun. 22, 2004

(54) METHOD FOR MAKING SELF-REGISTERING NON-LITHOGRAPHIC TRANSISTORS WITH ULTRASHORT CHANNEL LENGTHS

(75) Inventor: Hans Gude Gudesen, Brussels (BE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 10/293,488

(22) Filed: Nov. 14, 2002

(65) Prior Publication Data

US 2003/0100160 A1 May 29, 2003

Related U.S. Application Data

(60) Provisional application No. 60/333,750, filed on Nov. 29, 2001.

(30) Foreign Application Priority Data

Nov. 29, 2001 (NO) .......................................... 20 015837

(51) Int. Cl.$^7$ .......................................... H01L 21/8238
(52) U.S. Cl. ........................ 438/232; 438/305; 438/306; 438/286; 438/596
(58) Field of Search ................................. 438/232, 304, 438/305, 306, 286, 596, 947

(56) References Cited

U.S. PATENT DOCUMENTS 6,124,174 A 9/2000 Gardner et al.

6,638,441 B2 * 10/2003 Chang et al. .................. 216/46

FOREIGN PATENT DOCUMENTS

| EP | 0 710 989 | 5/1996 |
|---|---|---|
| GB | 2 230 899 | 10/1990 |

* cited by examiner

*Primary Examiner*—Richard Elms
*Assistant Examiner*—Beth E. Owens
(74) *Attorney, Agent, or Firm*—Jacobson Holman PLLC

(57) ABSTRACT

In a method for making transistors with ultrashort channel length, the deposition of respectively source, drain and gate electrodes initially can be performed with prior art technology limiting the electrode dimensions according to applicable design rules, while the dimensions of every second of these electrodes in subsequent process steps can be adjusted as desired. A channel area is formed between a source and a drain electrode without being constrained by any design rule and this allows the formation of transistor channels with extremely short channel lengths L, e.g. well below 10 nm. Correspondingly the width of the gate electrodes can be adjusted to also obtain a large channel width W and hence provide transistors with almost arbitrarily large aspect ratios W/L and thus desirable switching and current characteristics. The method can be applied to make any kind of field-effect transistor, even on the same substrate and may be adjusted for the fabrication of other kinds of transistor structures as well.

11 Claims, 4 Drawing Sheets

Figure 1:
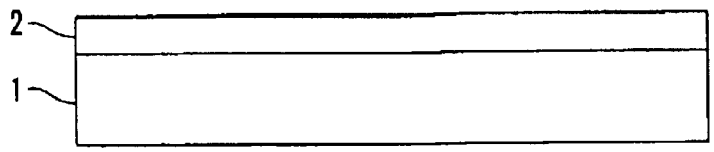

METHOD FOR MAKING SELF-REGISTERING NON-LITHOGRAPHIC TRANSISTORS WITH ULTRASHORT CHANNEL LENGTHS

This is a complete application claiming benefit of provisional 60/333,750 filed Nov. 29, 2001.

The present invention concerns a method for making transistors with ultrashort channel lengths.

Lots of efforts intend to reduce size of circuitry (on silicon or other substrates), combined with attempts to increase switching speeds by reducing channels lengths more than what follows from design rules and lithography. Circuitry reduction is part of the silicon world's extensive efforts, the limits are soon reached for photolithography, X-ray lithography and other more exotic approaches are very seriously being pursued, with the goal of reaching line widths and line distances around 0.04 μm (40 nm) in production within 2010. This, however, is still largely measured by what is desirable, e.g. single molecular switches, nanoswitches and the like.

Alternative, non-lithographic patterning techniques may hold better promise, e.g. micropatterning or self-assembly techniques. However, the latter are even more exotic than the most advanced lithography trials, since they introduce completely new processes and equipment into a very conservative industry. Also none of the two have the actual potential at present or possibly ever to allow the building of complex circuitry, partly because of registration issues, partly because of problems related to building multilayer structures. Other techniques (e.g. using hard stamps), are facing the same problems.

The problems that cannot be solved by known technology is: 1) making very short (few atoms long) channel lengths, i.e. the distance between the source and drain electrodes, 2) achieve this using either standard silicon procedures, fabrication techniques and equipment or non-standard, non-lithographic techniques, 3) use this to obtain smaller circuitry footprint, i.e. denser circuitry, with a given lithography/patterning tool, 4) achieve the above with self-registration.

Hence the object of the present invention is to provide a method that in an advantageous manner overcomes the inherent problems of present and prior art technology as listed above.

The object of the invention, as well as a number of further features and advantages are achieved with a method according to the invention comprising the following steps:

a) depositing a conducting material on a substrate of semiconductor material, b) patterning the conducting material into parallel strip-like first electrodes, with a pitch determined by an applicable design rule and leaving exposed strip-like areas of the substrate between the first electrodes, c) depositing a barrier layer covering the first electrodes down to the substrate, d) doping the substrate in the exposed areas thereof, e) depositing a conducting material over the doped areas of the substrate, thus forming parallel strip-like second electrodes thereabove, f) removing the barrier layer covering the first electrodes, leaving vertical channels extending down to the undoped areas of the substrate between the first and the second electrodes, g) doping the substrate in the exposed areas thereof at the bottom of the channels, h) filling the channels with a barrier material, i) removing the first electrodes, leaving openings between second electrodes and exposing areas of the substrate therebetween, j) doping the exposed areas of the substrate in the openings where the first electrodes have been removed, k) depositing a conducting material in the openings to regenerate the first electrodes, whereby an electrode layer of approximately equal-width parallel strip-like first and second electrodes are obtained, interfacing the doped substrate and separated by an arbitrarily thin layer of barrier material only, such that the first electrodes now either constitute source or drain electrodes and the second electrodes correspondingly drain or source electrodes of transistor structures, as dependent on the dopants used in the doping steps, l) depositing an insulating barrier layer over the electrodes and the separating barrier layers, m) depositing the conducting material on the top of the barrier layer, and n) patterning the conducting material to form parallel strip-like gate electrodes oriented crosswise to the source and drain electrodes, whereby a matrix of field-effect transistor structures are obtained with very short channel length and arbitrarily large channel width, the latter as given by the gate electrode patterned.

In the method according to the invention it is considered advantageous that the conducting material is a metal, or that the conducting material is selected as an organic material, preferably a polymer or a copolymer material.

Generally it is considered preferable that photomicrolithograpy is used in the patterning steps, but equally preferable non-lithographic tools could be used in the patterning steps.

In the method according to the invention the barrier layers and/or the electrodes preferably are removed by means of etching.

Preferably the thin-film/thin barrier layer is formed by a selective deposition process or alternatively the thin-film/thin barrier layer can be formed by spraying.

In the method according to the invention the patterning advantageously can be performed by means of etching.

In the method according to the invention it is also considered advantageous selecting the semiconductor substrate material as silicon.

Finally, in the method according to the invention the matrix or transistor structures can advantageously be divided up as appropriate to form individual field-effect transistors or circuits of more than one transistor of this kind.

Figure 2A:
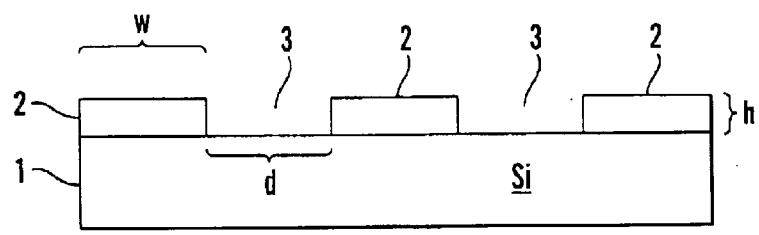
Figure 2B:
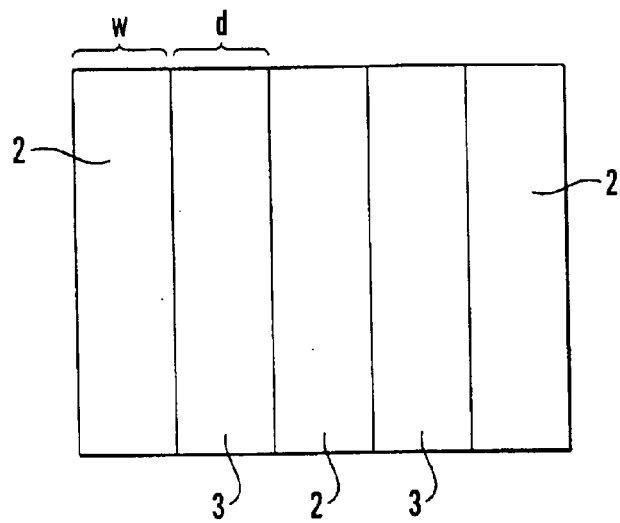
Figure 11B:
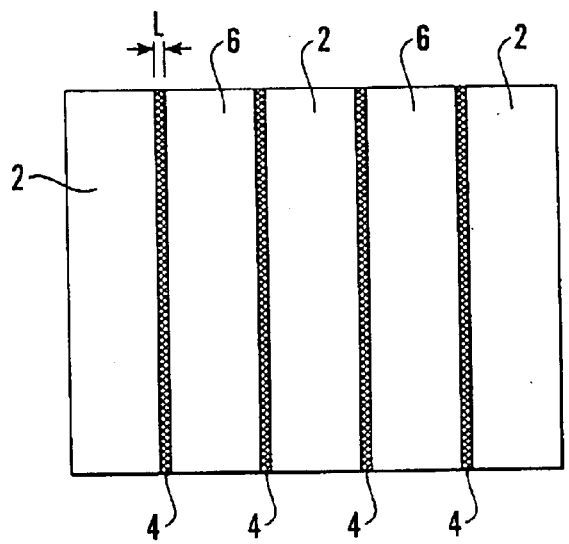
Figure 14A:
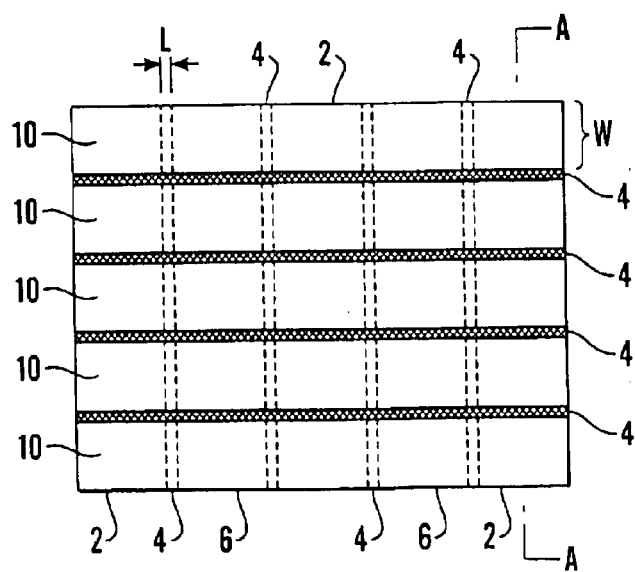
Figure 11A:
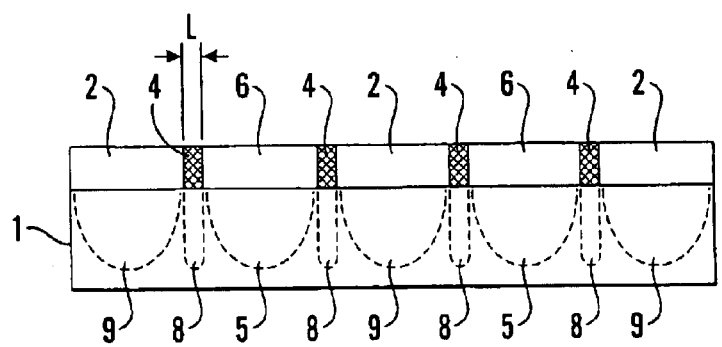
Figure 14B:
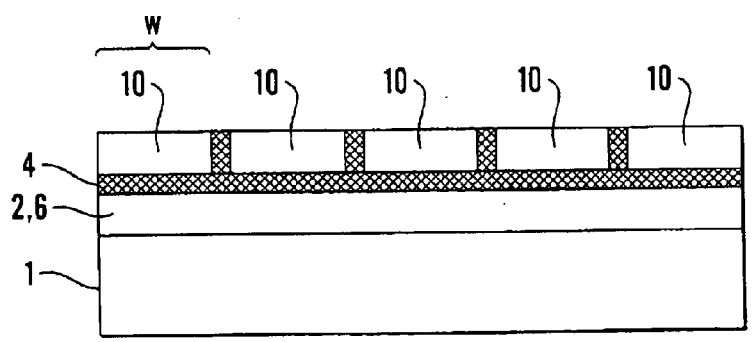

The invention shall be better understood when reading the following step by step exposition of the method for making transistors, with exemplary embodiments of the various steps and when read in conjunction with the drawing figures, of which FIGS. 1, 2a, 3–11a, 12 and 13 show the successive process steps of the method for making transistor structures according to the invention as rendered by cross sections of the structures resulting from each step, FIG. 2b a plan view of the structures rendered in cross section in FIG. 2a, FIG. 11b a plan view of the structures rendered in cross section in FIG. 11a, FIG. 14a a plan view of a field-effect transistor matrix made by the method according to the present invention with the outlines of channels and source and drain electrodes indicated by stitched lines, and FIG. 14b a cross section through the matrix in FIG. 14a taken along the line A—A.

Now the method according to the invention shall be discussed step by step.

Figure 3:
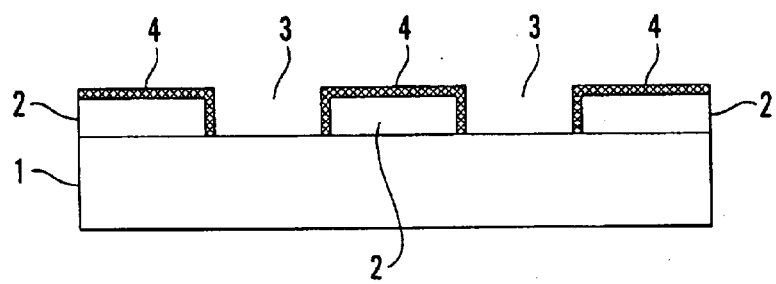

In FIG. 1 there is shown as a substrate 1 of semiconductor material with appropriate barrier layer upon which is deposited a layer 2 of conducting material which can be any conducting material, inorganic as well as organic and amenable to suitable deposition method. The substrate itself, depending on the material chosen, can be rigid or flexible. Preferably the substrate is silicon. Now the conducting layer 2 is patterned by suitable patterning method, e.g. based on photomicrolithography and subsequent etching, into parallel strip-like first electrodes as shown in FIG. 2a and the plan view of FIG. 2b. The pitch i.e. the width w of an electrode added to the distance d to the next electrode, will of course, be dependent on an applicable design rule and may correspond to a minimum process-constrained feature size f, in which case w and d will be about equal, but there is of course nothing to prevent a value of d much larger than that of w. The patterning leaves recesses 3 between the first electrodes 2 as shown in FIG. 2a, and now these parallel strip-like electrodes 2 which can be made very thin indeed, that is with height h much smaller than their width w are covered as shown in FIG. 3 by a thin-film barrier layer 4 which extends over the first electrodes 2 and down to the substrate 1 in the recesses 3. The barrier layer thickness is not constrained by any design rule and can hence be very small, actually down to monoatomic dimensions.

Figure 4:
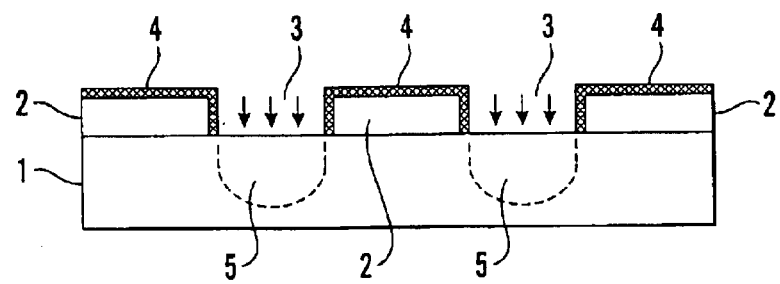

The bottoms of the recesses 3 will be exposed areas of the substrate 1 as shown in FIG. 3. The substrate 1 is now, as shown in FIG. 4, doped in these exposed areas to form doped regions 5 in the substrate 1 with a desired conduction mode, e.g. electronic or n-type conduction or hole or p-type conduction. In a following process step, shown in FIG. 5, the recesses 3 are now filled with a conducting material 6 to form second parallel strip-like second electrodes 6 over the doped areas 5 in the substrate 1. Subsequently, as shown in FIG. 6, the barrier layer 4 is removed from the first electrodes 2 by any suitable process, e.g. etching, and leaving vertical channels or grooves 7 between the first and second electrodes 2,6. The undoped areas of the substrate 1 will now be exposed at the bottom of the vertical channels 7, and in a second doping step shown in FIG. 7 the substrate in these areas is doped to form doped regions 8 therein. Obviously the dopant now will be chosen so that the substrate in the regions 8 are doped to the e.g. p-type conduction mode if the regions 5 were doped to n-type conduction mode or vice versa.

Figure 8:
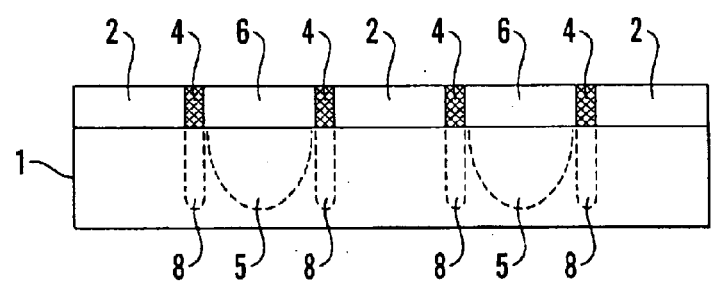
Figure 9:
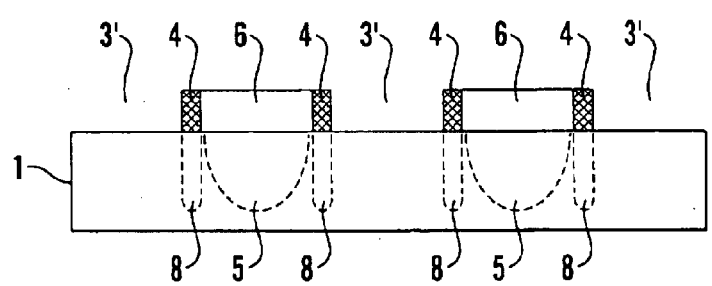
Figure 10:
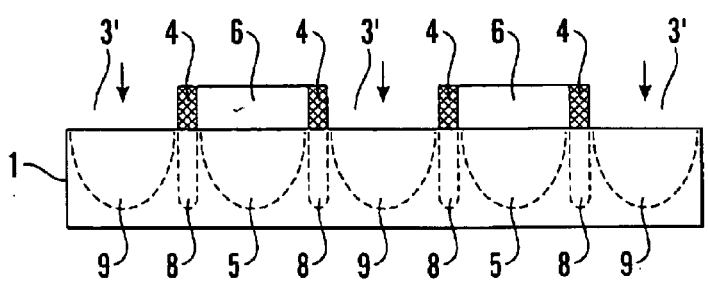

Then the vertical grooves or channels 7 are then filled with an insulating barrier material 4, which e.g. can be deposited in a controlled spraying process or depositing as global barrier layer with subsequent removal of excess material and this barrier material 4 shall now, of course, cover the areas of the substrate 1 above the doped regions 8 therein, as shown in FIG. 8. In the following process step the first electrodes 2 are removed leaving recesses or openings 3' between the second electrodes 6 with the barrier layers 4, as shown in FIG. 9. The removal of the first electrodes 2 can take place by e.g. photomicrolithography and etching and is followed by a third doping step whereby the now exposed and undoped areas of the substrate 1 in the openings 3' will be doped to form doped regions 9 in the substrate as rendered in FIG. 10. The regions 9 will be doped to the appropriate conduction mode, i.e. n-type if the regions 5 are doped to n-type and with the regions 8 doped to p-type. This can or course, be the other way around. In a subsequent process step the first electrodes are now regenerated as shown in FIG. 11a by simply filling the openings 3' above the doped regions 9 in the substrate 1 with a thin film of an appropriate conducting material which again may be inorganic or organic. In any case it should be understood that the same conducting material will preferably be used for the first and second electrodes 2;6. The resulting structure is shown in plan view in FIG. 11b.

Now it will be seen that the first and second electrodes 2,6 contacting appropriately doped regions 5, 8, 9 in the substrate 1 can form parallel strip-like and very closely spaced source and drain electrodes respectively in a transistor structure. The channel length L, i.e. the distance between e.g. a source electrode 2 and a drain electrode 4 (FIG. 11a), beneath the barrier layer 4 of course spans the doped regions 8 in the substrate and can be made extremely short, even well below 1 nm if so desired, because a thickness $\delta$ of the barrier layer 4 derives from a process for depositing of an extremely thin film of barrier material, and this process need not be constrained by any design rule. It is well-known to persons skilled in the art that it will be possible to deposit such barrier layers even as monoatomic layers, as mentioned above. The channel length 1 in the transistor structure made by the method according to the invention hence can be almost arbitrarily small and this is as will be seen, an extremely desirable property in e.g. field-effect transistors.

Figure 12:
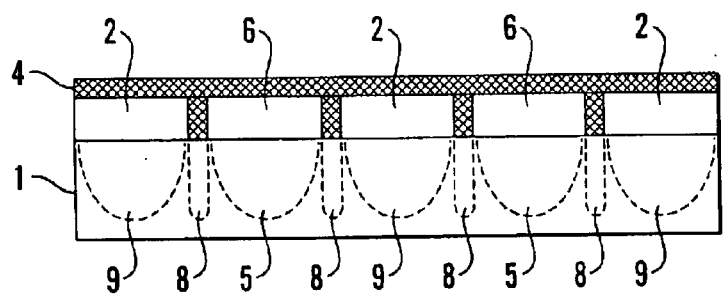
Figure 13:
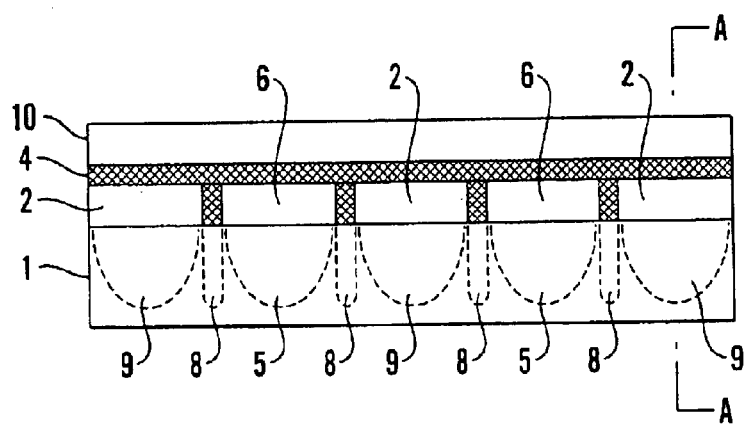

Also the top surface of the source and drain electrodes 2,6 is provided with barrier layer 4 such that the electrodes 2,6 in any case are mutually insulated and their top surfaces likewise insulated, as is shown in FIG. 12. Now a global layer of another thin film 10 of conducting material is deposited above the globally applied barrier layer 4 and the layer 10 can then be patterned to form gate electrodes of the transistor structures made by the method according to the invention. It shall be understood that the actual patterning of the gate electrodes can take place with process steps similar to those used for forming the first and second electrodes 2,6, and the various process steps then will mimic those depicted in FIGS. 1, 2a, 3 and 5. A very dense pattern of gate electrodes 10 can hence be obtained, and since every second of the gate electrodes are made in a patterning step which e.g. can be based on photomicrolithography and subsequent etching before depositing a suitable barrier layer, this of course implies that the obtainable dimensions of the gate electrodes will be subject to the same considerations as made in connection with the dimensions of the first and second electrodes 2,6. Hence it is entirely possible that to make the separate gate electrodes 10 with differing widths W, and this in turn implies that the separate transistor structures made by the method according to the invention can be made with varying channel width/channel length ratios W/L. As well-known to persons skilled in the art it is highly desirable to have a large W/L as the magnitude of the drain current $I_D$ depends on this ratio times the effective control voltage and a process parameter.

Thus a number of advantages can be obtained with transistors made by the method according to the present invention. For instance, the switching speed of the transistors is dependent on various factors, but the primary structural parameter affecting the switching speed will be the distance L between the source and drain electrodes as the charge carriers need a certain time to cover this distance. In other words, the shorter the distance L, the faster, ceteris paribus, the switching speed. Prior art solutions and present day technology will be limited by present process-constrained minimum feature sizes, which in case of e.g. 0.18 $\mu$m lithography implies a minimum 180 nm channel length. While a lithography conforming to present day standards still will be used in the electrode patterning step, it will be seen that the method according to the present invention actually allows a reduction in the channel length L to for instance much less than 10 nm, as the barrier layer thickness of course is not constrained by any design rule.

Figure 5:
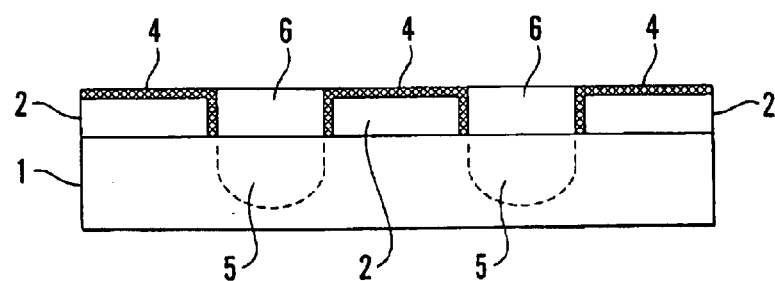
Figure 6:
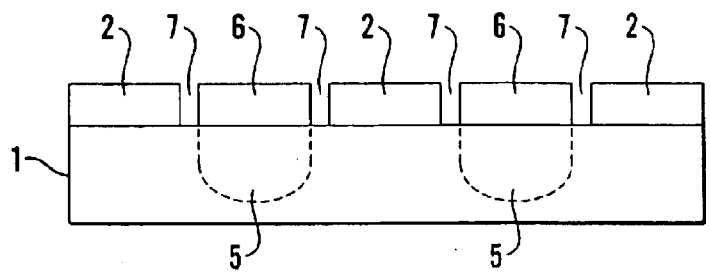
Figure 7:
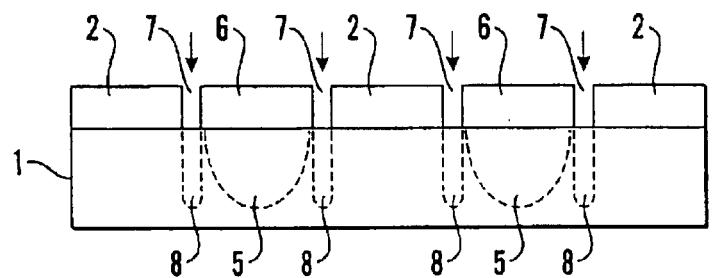

From FIG. 14b it will be seen that if the width W of a gate electrode, corresponding to a channel width will be limited downward to the design rule of the patterning process used to form this particular electrode, the gate electrodes formed in a moulding step similar to that shown in FIG. 5 for forming the electrode 6, may have their actual width W adjusted by simply increasing the thickness of the barrier layer 4 between the gate electrodes 10 before filling in the additional electrode material in the recess between the already patterned strip-like gate electrodes. Hence, for every second gate electrode in the transistor structure matrix it will now be possible to form gate electrodes so that transistors with varying widths W may be obtained.

Consequently one of the most important aspects of the method according to the present invention is the possibility of controlling the relationship between the channel width W and the channel length L, i.e. the aspect ratio W/L which is a very important design parameter, as it as stated serves as a scale factor for the drain current $I_D$. Moreover, the present invention shall allow for the fabrication of every type of field-effect transistors. Also it will be possible to fabricate structurally identical field-effect transistors on the same substrate, but with adjusted valued for selected design parameters. For instance two or more MOSFETS having just the same threshold voltage $V_T$, but different current capabilities, could be fabricated on the same substrate as it will be possible to use different values for W/L. High values for the drain current $I_D$, for instance in the range of several milliamperes, can of course, only be obtained in transistors with a high aspect ratio/W/L and with present day technology this means very area-consuming devices. With the present invention, the aspect ratio W/L can be chosen almost arbitrarily large without occupying a prohibitive amount of real estate. It is observed that the aspect ratio W/L can be increased to provide any desired current level, but in present day technology this implies an increased gate area and a corresponding increase in the device capacitance, which adversely shall affect the switching speed of the transistor, limiting e.g. prior art MOSFETs to aspects ratio W/L not much higher than 10. Such adverse aspects are all removed by fabricating the transistors with the use of the method according to the present invention.

Although the preferred embodiment discussed in the preceding pages lies on the use of conventional microphotolithographic and etching processes for the patterning of electrode structures, it is to be understood that the method of the present invention equally well can be realized with the use of more sophisticated patterning processes, including soft lithography and the use of non-lithographic tools such as e.g. hard or soft stamps for producing the desired patterns. In order to obtain a further reduction in the feature sizes, it is also possible to e.g. laying down electrode patterns by means of printing technology. Such printing technology can be performed relying on so-called nanoprinting that is currently being developed and would imply that e.g. electrode patterns could be obtained with a feature dimension of down to 10 nm or even less with comparable film thicknesses and thus be laid down on a scale comparable to the channel length attainable with the method according to the invention.

Moreover, the method according to the invention would by suitable choice of additional post-processing or intermediary steps allow fabrication of more complicated circuit structures on the same substrate, as conducting modes and design dimensions can be selected as appropriate and used to tailor specific types of field-effect transistors, while additional interlayers can be deposited e.g. to make transistor-based memories in a matrix-addressable array or to form complimentary transistor circuits. It is evident that e.g. portions of the transistor structures or whole transistor structures could be removed in e.g. etching steps and instead replaced by various passive components formed by e.g. thin-film technology, for instance resistors or interconnect lines, thus providing for more complicated circuitry in complete integration with the original transistor structures as made with the method of the present invention.

What is claimed is:

1. A method for making transistors with ultrashort channel lengths, the method comprising the following steps:

a) depositing a conducting material on a substrate of semiconductor material, b) patterning the conducting material into parallel stripe-like first electrodes, with a pitch determined by an applicable design rule and leaving exposed stripe-like areas of the substrate between the first electrodes, c) depositing a barrier layer covering the first electrodes down to the substrate, d) doping the substrate in the exposed areas thereof, e) depositing a conducting material over the doped areas of the substrate, thus forming parallel stripe-like second electrodes thereabove, f) removing the barrier layer covering the first electrodes, leaving vertical channels extending down to the undoped areas of the substrate between the first and the second electrodes, g) doping the substrate in the exposed areas thereof at the bottom of the channels, h) filling the channels with a barrier material, i) removing the first electrodes, leaving openings between second electrodes and exposing areas of the substrate therebetween, j) doping the exposed areas of the substrate in the openings where the first electrodes have been removed, k) depositing a conducting material in the openings to regenerate the first electrodes, whereby an electrode layer of approximately equal-width parallel stripe-like first and second electrodes are obtained, interfacing the doped substrate and separated by an arbitrarily thin layer of barrier material only, such that the first electrodes now either constitute source or drain electrodes and the second electrodes correspondingly drain or source electrodes of transistor structures, as dependent on the dopants used in the doping steps, l) depositing an insulating barrier layer over the electrodes and the separating barrier layers, m) depositing the conducting material on the top of the barrier layer, and n) patterning the conducting material to form parallel stripe-like gate electrodes oriented crosswise to the source and drain electrodes, whereby a matrix of field-effect transistor structures are obtained with very short channel length and arbitrarily large channel width, the latter as given by the gate electrode patterned.

2. The method according to claim 1, wherein the conducting material is a metal.

3. The method according to claim 1,
wherein the conducting material is a polymer or copolymer material.

4. The method according to claim 1,
wherein photomicrolithography is used in the patterning steps.

5. The method according to claim 1,
wherein non-lithographic tools are used in the patterning steps.

6. The method according to claim 1,
wherein at least one of the barrier layers and the electrodes are removed by etching.

7. The method according to claim 1,
wherein the thin-film/thin barrier layer is formed by a selective deposition process.

8. The method according to claim 1,
wherein the thin-film/thin barrier layer is performed by spraying.

9. The method according to claim 1,
wherein the patterning is performed by etching.

10. The method according to claim 1,
wherein the semiconductor substrate material is silicon.

11. The method according to claim 1,
wherein the matrix of transistor structures is divided up to form individual field-effect transistors or circuits of more than one transistor of this kind.

* * * * *